United States Patent [19]
Knapp et al.

[11] Patent Number: 6,049,254
[45] Date of Patent: Apr. 11, 2000

[54] PHASE-LOCKED LOOP WHICH CAN AUTOMATICALLY ADJUST TO AND LOCK UPON A VARIABLE INPUT FREQUENCY

[75] Inventors: David J. Knapp; David S. Trager; Tony Susanto; Larry L. Harris, all of Austin, Tex.

[73] Assignee: Oasis Design, Inc., Austin, Tex.

[21] Appl. No.: 08/951,650

[22] Filed: Oct. 16, 1997

[51] Int. Cl.$^7$ ........................................................ H03L 7/18
[52] U.S. Cl. ................................ 331/16; 331/25; 331/1 A; 331/17; 327/156; 327/159; 327/160
[58] Field of Search ................................ 331/16, 17, 1 A, 331/25, 1 R, 14; 327/156, 159, 160, 161, 107; 375/376

[56] References Cited

U.S. PATENT DOCUMENTS

| | | | |
|---|---|---|---|
| 4,516,083 | 5/1985 | Turney | 331/14 |
| 5,281,926 | 1/1994 | Rabii | 331/14 |
| 5,334,952 | 8/1994 | Maddy et al. | 331/1 A |
| 5,371,480 | 12/1994 | Hedberg et al. | 331/16 |

FOREIGN PATENT DOCUMENTS

| | | | |
|---|---|---|---|
| 3803965 A1 | 8/1989 | Germany . | |
| WO 97/20398 | 6/1997 | WIPO . | |

OTHER PUBLICATIONS

English Abstract for Patent Abstract of Japan; Publication No. 53054456; Publication Date May 17, 1978; Application Date Oct. 27, 1976; Application No. 51129919; Applicant Mitsubishi Electric Corp.

International Search Report for PCT/US 98/21889 mailed on Feb. 24, 1999.

*Primary Examiner*—Arnold Kinkead
*Attorney, Agent, or Firm*—Kevin L. Daffer; Conley, Rose & Tayon

[57] ABSTRACT

An apparatus is provided for automatically and dynamically adjusting a frequency division factor of a clock divider situated in the feedback loop of a phase-locked loop (PLL). The frequency division factor is modified based on changes in the input signal frequency forwarded to the PLL. If the input signal frequency increases, the decision circuit coupled to the input of the voltage controlled oscillator records that change as an encoded digital signal. That signal will accordingly modify the current frequency division factor dependent on current division factor as well as the current input signal frequency. The decision circuit can be modeled as an A/D converter, and the control unit placed between the decision circuit and the clock divider can be modeled as a state diagram. Each state of the state diagram is indicative of a frequency division factor, or a change in that division factor, wherein the coded digital signal indicates possible change from one state to another. By modifying the frequency division factor, the PLL can dynamically lock upon a changed input signal frequency without varying the clocking signal output from the PLL. Thus, the PLL can accommodate various input signal frequencies yet maintain a relatively fixed clocking signal to be forwarded as a timing reference to a digital processor.

10 Claims, 3 Drawing Sheets

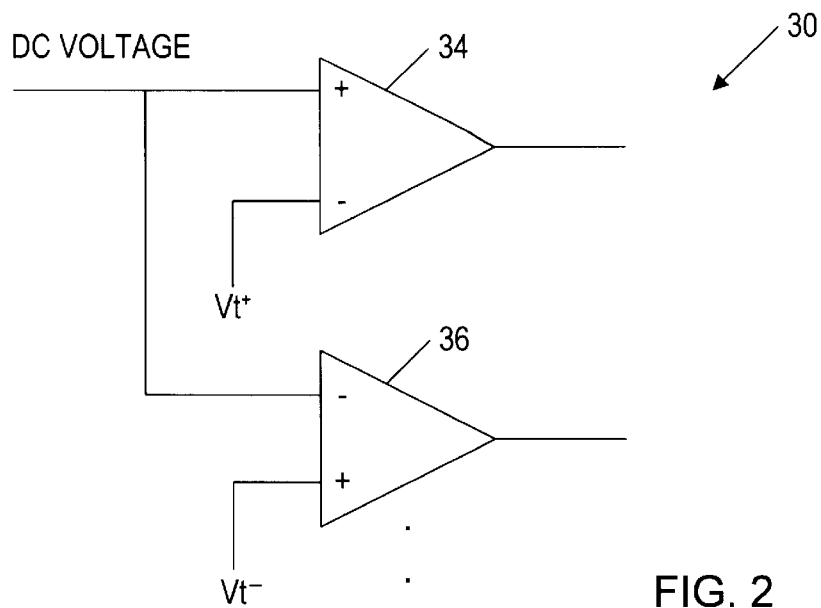
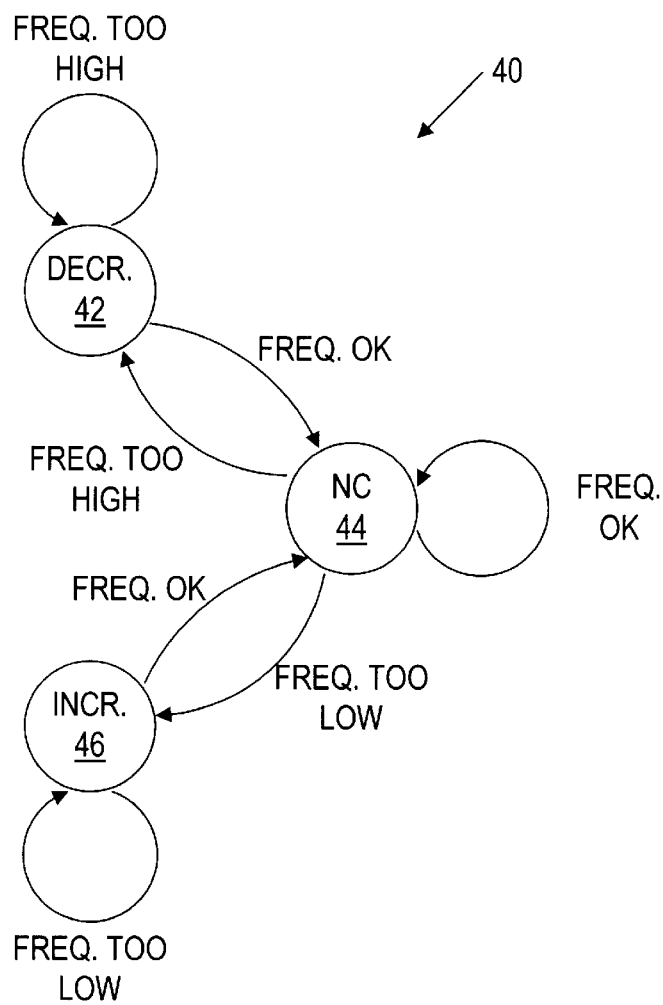
FIG. 2
FIG. 3

PHASE-LOCKED LOOP WHICH CAN AUTOMATICALLY ADJUST TO AND LOCK UPON A VARIABLE INPUT FREQUENCY

BACKGROUND OF THE INVENTION

1. Field of the Invention

This invention relates to an integrated circuit and, more particularly to a phase-locked loop ("PLL") which can, within the feedback loop of the PLL, automatically detect and incrementally or directly lock upon a change in frequency of an input signal without substantially changing the PLL output signal frequency.

2. Description of the Related Art

A PLL is generally used in many areas of electronics to control the frequency and/or phase of a signal. Instances of use include, for example, applications as frequency synthesizers, analog-to-digital modulators, and clock recovery circuits.

As a clock recovery circuit, a PLL extracts a timing reference from, for example, an incoming data stream. The timing reference, or recovered clock, is typically synchronized to transitions of data within the data stream. The timing reference is output from the PLL arranged at the receiving end of, for example, a transmission channel. Using a PLL at the receiving end to reconstruct a clocking signal avoids having to forward with the data a separate clocking signal.

It is often desirable to modify the transition rate, or frequency, of the data stream forwarded across a transmission channel. Thus, a PLL at the receive end of the transmission channel must be capable of accepting an input signal at a variety of frequencies. If the input signal comprises data, it is important that the PLL support both regular and high-speed data rates. If the input signal is a clocking signal, the PLL must therefore accept and be able to choose among a variety of clocking frequencies.

While the input signal frequency to the PLL can vary depending on the transmission rate of the transmission mechanism (i.e., transmitter, receiver and channel) it is generally desired that a digital circuit coupled to the PLL output run at a relatively fixed rate. In most instances, the clocking frequency of the digital circuit or digital processor must run at a frequency within the manufacturer specified frequency range. Thus, when the PLL is locked upon the input signal frequency, the output signal (hereinafter "clocking signal") from the PLL must not exceed (or be less than) the operating specification of the digital circuit or digital processor. If the input signal frequency should change given, for example, an increase in data rate, the PLL will attempt to lock upon the changed input signal frequency.

In most cases, a PILL is used in applications where the clocking signal frequency output from the PLL must be a multiple of the input signal frequency. This arises since, in most instances, the digital processor can operate at a higher frequency than the transmitted data stream. To achieve a static discrepancy between the input signal and clocking signal frequencies, a clock divider is situated in the feedback loop of the PLL. The clock divider comprises a frequency division factor. An increase in the division factor will proportionally increase the clocking signal frequency relative to the input signal frequency. Thus, for example, if the input signal frequency is at 1.0× and division factor is 16, then the clocking signal frequency is 16.0×.

An unfortunate aspect of the division factor is that it is typically static with changes in the input signal frequency. The inability to automatically or dynamically change commensurate with changes in the input signal frequency causes numerous problems with respect to the clocking signal. A static (or fixed) division factor presents a feedback signal frequency that will be momentarily dissimilar from an increasing input signal frequency during instances of "unlock". This will cause an increase in DC voltage to the PLL voltage controlled oscillator ("VCO"), resulting in an increase in the clocking signal frequency. Once the clocking signal achieves a steady state value, and the clocking signal is divided in the PLL feedback loop to substantially match the input signal frequency, then the PLL is said to be "locked". Unfortunately, when locked, the clocking signal may exceed the maximum frequency of the digital processor to which the clocking signal is connected. If this should occur, then the digital processor may lose its internal state and/or malfunction. Furthermore, if the clocking signal exceeds the maximum frequency of the digital processor, the VCO may be forced outside its dynamic operating range.

SUMMARY OF THE INVENTION

The problems outlined above are in large part solved by improvements to the PLL. Improvements involve, for example, inserting a decision circuit between the loop filter and VCO of the PLL. The decision circuit monitors DC voltage applied to the VCO indicative of a change in frequency of the input signal. The decision circuit presents a coded signal to a control unit indicative of the DC voltage relative to one or more threshold voltages. The control unit responds to the coded signal by either maintaining or modifying the frequency division factor within the clock divider of the PLL feedback loop. Input to the VCO is therefore indicative of the frequency of the input signal.

The decision circuit in combination with the control unit provide a control function that can select an appropriate division factor based on the DC voltage at the input of the VCO. The decision circuit can be implemented as, for example, an analog-to-digital ("A/D") converter which essentially takes a DC value and produces a digital coded signal based on the relationship of the that DC value to one or more reference voltages. The control unit can be implemented in hardware or software to recognize various digital encoded signals in dissimilar ways and to produce a unique modification of the division factor dependent on the existing (current) division factor M or the existing division factor M and the existing (current) input signal frequency.

The decision circuit and control unit serves to adapt the PLL via the clock divider to high speed and low speed incoming data and/or clocking input frequencies. If the input signal frequency should increase to accommodate a faster data stream, the decision circuit will respond by dispatching a coded signal based on an increase in the DC voltage at the input of the VCO, relative to a reference voltage. The coded signal will then be interpreted by the control unit based on the current status of the clock divider division factor. Depending on how the control unit is programmed, an increase in the input signal frequency may preferably cause a proportional decrease in the frequency division factor of the clock divider. This will result in two important outcomes. First, the feedback signal frequency forwarded from the clock divider, based on the new frequency division factor, will substantially equate to the input signal frequency thereby locking the PLL in a rapid fashion. Without a differential between the feedback signal frequency and the input signal frequency, the DC voltage will quickly transition back to a mid-scale, locked value relative to the voltage reference values so as not to cause further transitions of the frequency division factor. Second, the clocking signal output from the PLL will retain its previous frequency and will be minimally affected in the interim when the increased input signal frequency occurs and the time in which the frequency division factor is changed. Accordingly, the present apparatus and/or circuit achieves a rapid locked status to a variable input signal frequency without modifying or varying the clocking signal forwarded to, for example, a down-stream digital circuit.

As an alternative, the feedback signal frequency may not substantially equate to a changed input signal frequency after a first iterative change of the frequency division factor. The DC voltage may remain or transition back above threshold even after the frequency division factor is changed. Another (second and subsequent) iterative change may be needed to cause the DC voltage to remain at mid-scale (i.e., to lock the input and output signal frequencies). In instances where the current output signal frequency is known and the frequency division factor is (after one or more iterative changes) known, then the present technique can be used to determine the frequency of the changed (i.e., next) input signal or data rate. The decision circuit and control unit thereby allow automatic detection of the input signal frequency either directly or through iterative changes in the division factor. A direct change needed to rapidly lock upon the input signal implies a high resolution frequency division factor, the magnitude of differences between a current divider state and a next divider state can be any integer or fractional number.

Broadly speaking, the present invention contemplates a PLL. The PLL comprises a clock divider circuit arranged within a feed back loop of the PLL. The clock divider comprises a frequency division factor adapted to be preferably modified inversely proportional to a change in the frequency of an input signal forwarded to the PLL. The frequency division factor is modified by multiplying a current frequency division factor by a positive number M greater than 1.0, and wherein the change in frequency of the input signal is modified by multiplying a current frequency of the input signal by 1/M. Alternatively, the frequency division factor can be modified by multiplying a current frequency division factor by 1/M, such that the change in frequency of the input signal is modified by multiplying a current frequency of the input signal by M.

The present invention further contemplates an apparatus. The apparatus is coupled to receive an input signal frequency and produce an output signal frequency (i.e., clocking signal frequency). A phase detector and loop filter are coupled to produce a DC voltage corresponding to a difference between the input signal frequency and the output signal frequency reduced by a division factor. A VCO is coupled to receive the DC voltage and change the output signal frequency dependent on the DC voltage. A clock divider circuit is coupled to receive the output frequency and, in accordance with the division factor, forward the output signal frequency reduced by a division factor to the phase detector. A decision circuit is coupled to receive the DC voltage and produce a coded signal based on the comparison of the DC voltage to the reference voltage. A control unit is coupled to receive the coded signal and automatically (dynamically) modify the frequency division factor in response thereto.

The present invention yet further contemplates a method for automatically and dynamically changing a clock divider within a feedback loop of a PLL. The clock divider is changed in order to directly or iteratively lock the frequency of the clocking signal to the frequency of an input signal. The method further includes steps of monitoring a DC voltage from a detector which compares phase and frequency of a feedback signal to the input signal. The frequency of the feedback signal can be changed to substantially match a change in frequency of the input signal while maintaining substantially constant the frequency of the output signal. The feedback signal frequency is changed based on a comparison of a reference voltage to the DC voltage prior to the readjustment of the feedback signal to bring the feedback signal frequency in line again with the changed input signal frequency.

BRIEF DESCRIPTION OF THE DRAWINGS

Other objects and advantages of the invention will become apparent upon reading the following detailed description and upon reference to the accompanying drawings in which:

FIG. 2 is circuit diagram of a decision circuit as shown in FIG. 1 according to one exemplary embodiment; and FIG. 3 is a state diagram of a control unit as shown in FIG. 1, according to one exemplary embodiment, for performing iterative ranging/detection of the PLL frequency division factor to a change in frequency of the input signal;

Figure 1:
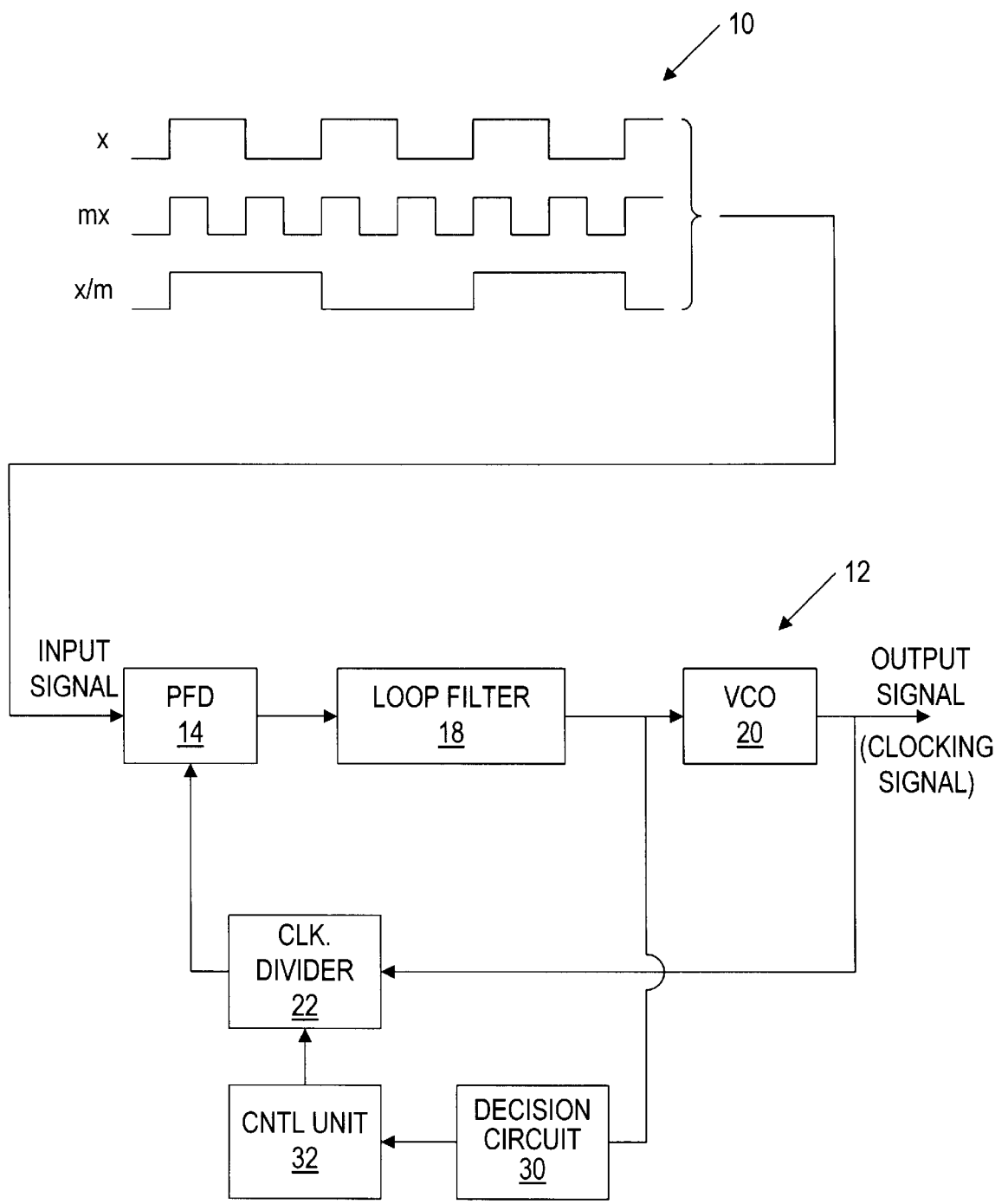
FIG. 1 is a block diagram of a PLL according to the present invention configured to receive and lock upon a frequency of an input signals having a variable frequency.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Turning now to the drawings, FIG. 1 illustrates a signal 10 input to a PLL 12. The input signal can be forwarded at different frequencies, shown as x, mx and x/m. wherein m represents a variation of the base frequency x. If a need exists for a higher data rate, for example, then the input signal frequency can be increased; the same applies if the data rate must be reduced. The frequency of the input signal is mostly a function of the transmitting and receiving component and therefore can vary dissimilar from the components within PLL 12.

PLL 12 includes, according to one example, a phase/frequency ("PFD") detector 14, a loop filter 18, a VCO 20 and a clock divider 22. Clock divider 22 is placed in the feedback loop of PLL 12, and provides a multiplication factor between the input signal frequency and a higher frequency output signal. PFD 14 can be formulated, for example, as a multiplier (or mixer) comprising an exclusive OR gate, a R-S latch or, in the instance of frequency detection, any circuit which produces non-complimentary outputs proportional to the frequency differences between the inputs. Loop filter 18 may be implemented with passive elements comprising a capacitor and a resistor linked between conductors bearing the output from PFD 14 and the input to VCO 20. Loop filter 18 may serve to remove transient noise from the rail-driven signal forwarded from PFD 14, and therefore provides stability to the loop. That noise may be attributed to, for example, input signal flicker and/or PFD 14 transient conditions. VCO 20 may be implemented, for example, as a ring oscillator comprising, for example, an odd number of series-connected inverters.

The components shown in PLL 12 can be made in numerous different ways. The mechanism and circuitry needed to embody each component can vary depending on the accuracy and application desired. The examples described are therefore only examples of ways to implement each component. Variations and modifications may be made to the form and structure of each component as mandated by the application in which the components are placed.

VCO 20 is designed to produce a periodic output whose frequency is a linear function of the DC voltage forwarded from loop filter 18. If the DC voltage increases, for example, then VCO 20 will increase the output signal frequency. The output signal is forwarded to the digital circuit coupled as a load to PLL 12 as well as to clock divider 22. Clock divider 22 includes a frequency division factor which enables the output signal (clocking signal) frequency to be a multiple of the input signal frequency. Thus, the clocking signal frequency is reduced (i.e., divided) before it is fed back to PFD 14. The frequency division factor M is modified in real-time depending on the amount of frequency multiplication needed. Thus, factor M is a number equal to or greater than 1.0. If M is an integer, frequency division can be suitably performed, for example, by a digital counter.

Included with or separate from PLL 12 is a decision circuit 30 and a control unit 32. Decision circuit 30 is essentially a A/D converter which encodes in digital form the comparison of a reference voltage (or reference voltages) to the DC voltage forwarded to VCO 20. For example, there may be two reference voltages in the simplest form. A first reference voltage can be configured between the mid-scale voltage and $V_{DD}$, whereas the second reference voltage may be placed between the mid-scale voltage and ground. If, for example, the DC voltage exceeds the first reference voltage, (possibly indicating a rapid rise in the input signal frequency) the decision circuit will encode a binary signal indicating that rise. The converse is true if the input signal frequency decreases and the DC voltage extends below the second reference voltage to produce another, uniquely encoded signal. It is recognized that, however, more than two reference voltages may be used. If the DC voltage exceeds midscale and one but not another reference voltage, the digital signal resulting from the comparison will have sufficient binary bits to indicate the window between reference voltages at which the DC voltage resides.

FIG. 2 illustrates one example of decision circuit 30 which generally performs A/D encoding. If two reference voltages are used, then a first comparator 34 will produce a digital "1" value if the DC voltage exceeds the first reference voltage $v_{r+}$. A second comparator will produce a digital "1" value if the DC voltage is less than a second reference voltage $v_{r-}$. According to one example, the first reference voltage may be a value between mid-scale and $V_{DD}$ while the second reference voltage is between mid-scale and ground. Of course, there may be numerous other comparators and associated reference voltages. The additional reference voltages may be spaced quantifiable distances from one another between ground and $V_{DD}$ to enhance resolution of the A/D converter output. The example shown in FIG. 2 presents a coded two-bit output. However, additional comparators and associated reference voltages can encode more than two binary bits if additional resolution of PLL frequency is desired.

Two comparators and two reference voltages provide a two bit binary value indicative of whether the DC voltage is: (1) above $v_{r+}$, (2) between $v_{r-}$ and $v_{r+}$, or (3) below $v_{r-}$. Additional comparators and reference voltages allow indication of where the DC voltage is within a closely defined voltage range. Given close indication of DC voltage, control unit 32 may more rapidly (and directly) respond to that voltage by transitioning to an appropriate "next" divider state knowing the current divider state. If, however, only two comparators are used, then an auto ranging function can occur. More particularly, an iterative change in divider state can occur to ultimately achieve the direct change afforded by the high resolution. FIG. 3 illustrates the iterative detection technique, while FIG. 4 illustrates direct detection.

FIG. 3 is a state diagram 40 used in implementing control unit 32 according to an iterative, auto-ranging technique. Diagram 40 illustrates three states 42, 44 and 46. State 42 indicates a decrement in the frequency division factor within clock divider 22 if the input signal frequency, as registered by the DC voltage on decision circuit 30, is above an upper threshold (e.g., $v_{r+}$). If the input signal frequency is not too high, then transition will occur to state 44 indicative of DC voltage between the upper and lower thresholds. Further, if the DC voltage extends below the lower threshold indicating a low frequency, then transition will occur toward state 46 from state 44. State diagram 40 presumes three detectable levels and two comparators, and the next level is adjacent the current level in magnitude. For example, if the current input frequency is 4× and the next input frequency increases to 16×, then the DC value will extend above the upper threshold and be coded as a "frequency too high" signal upon the control unit. The control unit responds as shown by state diagram 40 by decrementing the division factor from, e.g., a ÷16 to a ÷15. Decrementing continues if the decision circuit again codes a frequency to high signal until eventually the proper frequency division factor is reached, e.g., ÷4.

At least one benefit in the iterative approach is its use as an input signal frequency detector. Knowing that the output signal frequency must remain relatively fixed and further knowing the current frequency division factor, one can determine the next input signal frequency when or if the input signal frequency changes. The iterative approach will change according to defined increments (i.e., integers and/or fractions) the division factor whenever the DC voltage exceeds or is less than the threshold values. Those increments will eventually cause the DC voltage to remain near midscale indicating state 44 and a corresponding locked condition. The frequency division factor at state 44 will be known along with the unchanged output signal frequency to thereby allow detection of the changed (i.e., next) input signal frequency.

Figure 4:
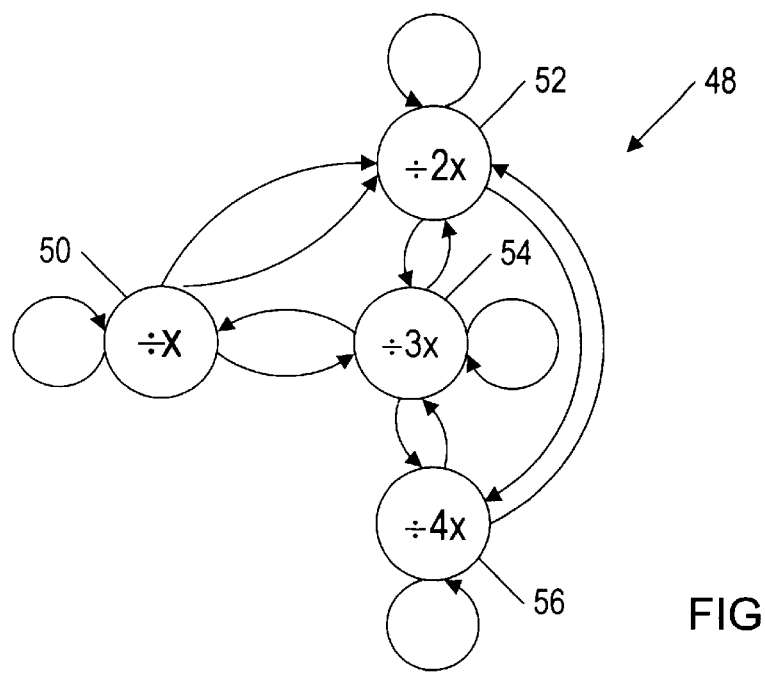
FIG. 4 is a state diagram of a control unit as shown in FIG. 1, according to one exemplary embodiment for performing direct detection of the PLL frequency division factor to a change in frequency of the input signal.

FIG. 4 is a state diagram 48 used to implement control unit 32 according to a more direct, rapid detection/locking function. More than two levels and three comparators are required if it is necessary to change the division factor commensurate with a DC voltage within a rather narrowly defined window. In the example of FIG. 4, seven levels and eight comparators can be used to produce the various windows. Division factor can change directly between any of states 50, 52, 54 and 56. Thus, FIG. 4 indicates coding that requires at least three encoded bits (i.e., representing seven windows or states) to carry out a transition from one frequency division state to any of the others.

Figure 5:
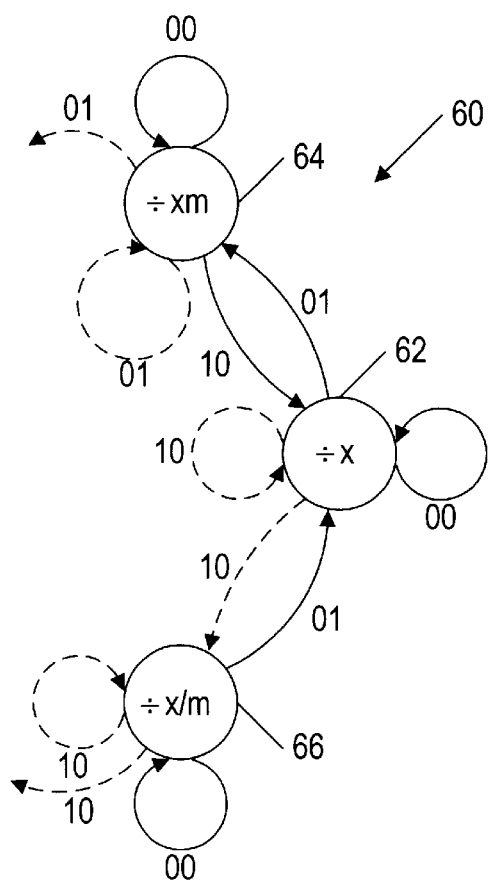
FIG. 5 is a state diagram of the control unit as shown in FIG. 1, according to a more generalized, exemplary embodiment, for performing iterative ranging/detection and direct, high resolution ranging/detection of the PLL, frequency division factor to a change in frequency of the input signal.

FIG. 5 illustrates a more generalized state diagram of 60 used for implementing control unit 32. Depending upon the values of M and the options shown in dashed line, direct detection/locking or iterative ranging to ultimate locking can occur. State diagram 60 can be embodied either in hardware or software to recognize a coded digital signal and therefore modify the division factor from the current frequency division factor to the next frequency division factor. Thus, the coded signal indicates possible change in the input signal frequency, and state diagram 60 indicates the affect of the coded signal on the clock divider 22 (shown in FIG. 1).

For example, if the current division factor is modeled as x, as shown by state 62, then the division factor can change or remain in its current state. If the encoded signal is 00, then state 62 will remain. However, if the encoded signal is 01, then division factor will change from state 62 to state 64. If, however, the encoded signal is 10, then the division factor may remain the same or transition to state 66. The option is shown by the dashed lines adjacent coded signals 10.

An examination of state diagram 60 indicates an increase in the frequency division factor from state 66, to state 62, and then to state 64 whenever the encoded signal is 01. A reduction in frequency division factor conversely occurs if the encoded signal is 10. It is appreciated that while three states are shown, there may be more than three depending on the amount of bits within the encoded signal and the amount of resolution needed for achieving an appropriate frequency division.

To aid in understanding how state diagram 60 might be carried out according to one example, a further example will be presented. Assuming x within state 62 is 4, and m in states 64 and 66 is also 4, it is apparent that state 62 represents a ÷4 state, and state 64 represents a ÷16 state. Solely for the benefit and understanding the functionality of states 62 and 64, for the example provided, the following Table 1 is presented:

frequency remains as 16× (i.e., 4× current/next input frequency times the current/next divider state).

The next line of Table 1 indicates what would happen if the input signal frequency decreases from 4× to 1×. A decrease in DC voltage will occur as a result of the decrease in input signal frequency, thus producing a compare high/low coded signal of 01. The 01 coded signal, as shown in FIG. 5, will cause a change in state from state 62 to state 64. This is indicated as a change in a ÷4 as the current divider state to a ÷16 (where m in state 64 is equal to 4). The current/next output frequency, however, remains unchanged at 16× since the current divider state multiplied by the current input frequency equals the next divider state multiplied by the next input frequency.

Line 3 in Table 1 becomes apparent given the previous descriptions of lines 1 and 2. However, it is illustrated that, as an example, a compare high/low encoded signal of 10 may not effect (or change) the divide-by-state. However, it is understood that, if desired, a 10 encoded value may cause a state transition if there are more than two states. In the example of Table 1, only two states are illustrated only for sake of brevity. FIG. 5, however, depicts a third state, and possibly numerous other states, and the effect of coded signal 10 on the transition from state 62 to state 66.

Lines 4 through 6 of Table 1, in conjunction with FIG. 5) indicate transition from state 64 to state 62 if the coded signal is 10. Otherwise, in the example provided, state 64 remains if the encoded signals are 00 or 01.

The example shown in Table 1 is indicative of two dissimilar input signal frequencies and two dissimilar clock divider states. Further as an example, Table 1 indicates a two-bit encoded signal derived from only two comparators and only two dissimilar threshold voltages applied to those comparators. It is recognized, however, that numerous input signal frequencies can be applied, as well as numerous clock divider states and comparators, reference voltage, etc. Regardless of the number of input signal frequencies and clock division states, the intent remains the same. If the input signal frequency is higher than the feedback signal frequency forwarded from the clock divider, the feedback loop will cause the VCO input voltage to increase to try and

TABLE 1

| CURRENT DIVIDER STATE | CURRENT INPUT FREQ. | COMP. HIGH | COMP LOW | NEXT DIVIDER STATE | NEXT INPUT FREQ. | CURRENT NEXT OUTPUT FREQ. |
|---|---|---|---|---|---|---|
| ÷4 | 4 x | 0 | 0 | ÷4 | 4 x | 16 x |
| ÷4 | 4 x | 0 | 1 | ÷16 | 1 x | 16 x |
| ÷4 | 4 x | 1 | 0 | ÷4 | 4 x | 16 x |
| ÷16 | 1 x | 0 | 0 | ÷16 | 1 x | 16 x |
| ÷16 | 1 x | 0 | 1 | ÷16 | 1 x | 16 x |
| ÷16 | 1 x | 1 | 0 | ÷4 | 4 x | 16 x |

Referring to FIGS. 1–4 and Table 1 in conjunction, the first line in Table 1 indicates a current divider state within clock divider 22 of a ÷4. Additionally, the current input frequency is 4× (where m in FIG. 1 is equal to 4). From those pre-existing conditions, line 1 indicates the next input frequency remains at 4×. This does not produce a DC voltage which would extend above or below the threshold voltages. Accordingly, the compare high/low outputs from high comparator 34 and low comparator 36 is 00. The effect of 00 coded signal upon state 62 (where x equals 4) is no change whatsoever. Accordingly, the next divider state remains as state 62 (i.e., ÷4). Thus, the current/next output signal match the input signal frequency. Similarly, if the input signal frequency is below the feed back signal frequency, the feedback loop will cause the VCO input voltage to decrease and try and match the input signal frequency. If any of the comparators produce a "1" output, this means the input signal frequency is either too high or too low for the current frequency range set by clock divider 22. Control unit 32 evaluates the decision circuit 30 coded output and selects the appropriate clock divider control signal value to allow PLL 12 to lock to the input signal frequency.

The intent behind control unit 32 is to maintain, increase or decrease the division factor within clock divider 22 from its current value. This causes reset of the VCO input voltage back to mid-scale. The PLL will then lock to the input signal frequency and the decision circuit next output will be, for example, 00.

It will be appreciated by those skilled in the art having the benefit of this disclosure that this invention is believed to be capable of applications with any integrated circuit having both analog and digital portions. The integrated circuit may include the PLL, the decision circuit and the control unit all within a single monolithic substrate. It is intended that the following claims be interpreted to embrace all such modifications and changes and, accordingly, the specification and drawings are to be regarded in an illustrative rather than a restrictive sense.

What is claimed is:

1. A phase-locked loop, comprising a clock divider circuit operably coupled to an output of a voltage controlled oscillator within a feedback loop of the phase-locked loop, said clock divider comprising a frequency division factor adapted to be modified inversely proportional to a change in frequency of an input signal forwarded to the phase-locked loop, the frequency of an output signal forwarded from the PLL is adapted to be maintained substantilly constant relative to said change in frequency of the input signal, and wherein said frequency division factor is adapted to be modified by a decision circuit operably coupled to an input of the voltage controlled oscillator to determine whether the change in frequency of the input signal exceeds a threshold amount.

2. The phase-locked loop as recited in claim 1, wherein said decision circuit comprises a plurality of comparators, each of which is connected to receive a de voltage proportional to the change in frequency of the input signal.

3. The phase-locked loop as recited in claim 2, wherein each of the plurality of comparators is further connected to receive a unique reference voltage to which the de voltage is compared.

4. An apparatus coupled to receive an input signal frequency and produce an output signal frequency, the apparatus comprising:
- a phase detector coupled to produce a dc voltage corresponding to a difference between the input signal frequency and the output signal frequency reduced by a division factor;
- a voltage controlled oscillator coupled to receive the dc voltage and change the output signal frequency dependent on the de voltage;
- a clock divider circuit coupled to receive the output signal frequency and, in accordance with the division factor, forward the output signal frequency reduced by the division factor to the phase detector;
- a decision circuit coupled to receive the dc voltage and produce an encoded signal based on a comparison of the dc voltage to a reference voltage; and
- a control unit coupled to receive the encoded signal and modify the division factor in response thereto, and wherein modification of the frequency division factor is inversely proportional to a change in the input signal frequency such that a relatively constant output signal frequency is maintained.

5. The apparatus as recited in claim 4, wherein said control unit dispatches a control signal based on a current frequency division factor and the encoded signal.

6. The apparatus as recited in claim 4, wherein said encoded signal comprises binary bits.

7. The apparatus as recited in claim 4, wherein the number of said binary bits is two.

8. The apparatus as recited in claim 4, wherein said phase detector comprises a frequency detector.

9. A method for changing a clock divider within a feedback loop of a phase-locked loop for locking the frequency of an output signal to the frequency of an input signal forwarded from and to, respectively, the phase-locked loop, said method comprising:
- monitoring a dc voltage output from a detector which compares phase and frequency of a feedback signal to the input signal; and
- changing the frequency of the feedback signal to substantially match a change in frequency of the input signal while maintaining substantially constant the frequency of the output signal based on a comparison of a reference voltage to the dc voltage prior to the change in frequency of the feedback signal, wherein said changing comprises reducing the frequency of the feedback signal inversely proportional to increasing the frequency of the input signal.

10. A method for changing a clock divider within a feedback loop of a phase-locked loop for locking the frequency of an output signal to the frequency of an input signal forwarded from and to, respectively, the phase-locked loop, said method comprising:
- monitoring a dc voltage output from a detector which compares phase and frequency of a feedback signal to the input signal; and
- changing the frequency of the feedback signal to substantially match a change in frequency of the input signal while maintaining substantially constant the frequency of the output signal based on a comparison of a reference voltage to the dc voltage prior to the change in frequency of the feedback signal, wherein said changing comprises increasing the frequency of the feedback signal inversely proportional to reducing the frequency of the input signal.

* * * * *

UNITED STATES PATENT AND TRADEMARK OFFICE
CERTIFICATE OF CORRECTION

PATENT NO. : 6,049,254
DATED : April 11, 2000
INVENTOR(S) : Knapp, et. al.

It is certified that error appears in the above-indentified patent and that said Letters Patent is hereby Claim 2, col. 9, line 32, after the phrase "connected to receive a" please delete "de" and substitute therefor --dc--.

Claim 3, col. 9, line 36, after the phrase "voltage to which the" please delete "de" and substitute therefor --dc--.

Claim 4, col. 9, lines 46-47, after the phrase "frequency dependent on the" please delete "de" and substitute therefor --dc--.

Signed and Sealed this

Twentieth Day of March, 2001

*Attest:*

NICHOLAS P. GODICI

*Attesting Officer*  *Acting Director of the United States Patent and Trademark Office*